(12) United States Patent
Kuhmann et al.

(10) Patent No.: US 7,253,388 B2
(45) Date of Patent: Aug. 7, 2007

(54) ASSEMBLY WITH SELF-ALIGNMENT FEATURES TO POSITION A COVER ON A SUBSTRATE THAT SUPPORTS A MICRO COMPONENT

(75) Inventors: Jochen Kuhmann, Berlin (DE); Matthias Heschel, Rodovre (DK)

(73) Assignee: Hymite A/S, Kgs. Lyngby (DE)

( * ) Notice: Subject to any disclaimer, the term of this patent is extended or adjusted under 35 U.S.C. 154(b) by 150 days.

(21) Appl. No.: 10/848,498

(22) Filed: May 17, 2004

(65) Prior Publication Data
US 2005/0236562 A1 Oct. 27, 2005

Related U.S. Application Data

(60) Provisional application No. 60/565,217, filed on Apr. 23, 2004.

(51) Int. Cl.
H01L 27/00 (2006.01)
H01L 31/0232 (2006.01)
H01L 31/113 (2006.01)
H01L 21/00 (2006.01)
H01J 40/14 (2006.01)

(52) U.S. Cl. .................. 250/208.1; 250/239; 257/432; 257/291; 438/64

(58) Field of Classification Search ............... 250/239, 250/208.1; 257/113, 183.1, 291, 431–433, 257/222, 258, 184; 438/64, 7, 15, 25–27
See application file for complete search history.

(56) References Cited

U.S. PATENT DOCUMENTS

| | | | |
|---|---|---|---|
| 4,366,342 A * | 12/1982 | Breedlove | 174/52.4 |
| 5,337,396 A | 8/1994 | Chen et al. | 385/92 |
| 5,424,573 A | 6/1995 | Kato et al. | 257/431 |
| 5,436,492 A * | 7/1995 | Yamanaka | 257/433 |
| 5,914,488 A * | 6/1999 | Sone | 250/338.1 |
| 6,383,835 B1 * | 5/2002 | Hata et al. | 438/65 |
| 6,565,267 B2 | 5/2003 | Abe et al. | 385/88 |
| 6,595,700 B2 | 7/2003 | Steinberg et al. | 385/92 |
| 6,705,770 B2 | 3/2004 | Asai | 385/92 |
| 6,710,945 B1 * | 3/2004 | Miranda | 359/819 |
| 2002/0167063 A1 * | 11/2002 | Fujimoto et al. | 257/435 |
| 2002/0168152 A1 | 11/2002 | Abe et al. | 385/88 |

FOREIGN PATENT DOCUMENTS

EP  0 950 204 B1  1/2002

* cited by examiner

*Primary Examiner*—Georgia Epps
*Assistant Examiner*—Kevin Wyatt
(74) *Attorney, Agent, or Firm*—Fish & Richardson P.C.

(57) ABSTRACT

The substrate includes an alignment slot in at least one of its side edges, and includes metallization coupled electrically to the micro component and extending from the front surface of the substrate to its back surface via at least one of the alignment slots. The assembly also includes a cover attached to the substrate so as to encapsulate the micro component. The cover includes at least one protrusion on its underside such that each protrusion mates with a respective alignment slot in the side edges of the substrate.

17 Claims, 2 Drawing Sheets

ASSEMBLY WITH SELF-ALIGNMENT FEATURES TO POSITION A COVER ON A SUBSTRATE THAT SUPPORTS A MICRO COMPONENT

CROSS-REFERENCE TO RELATED APPLICATIONS

This application claims the benefit of priority from U.S. provisional patent application No. 60/565,217, filed on Apr. 23, 2004. The disclosure of the provisional application is incorporated herein by reference.

BACKGROUND

The disclosure relates to an assembly, such as a low-cost package, that uses a self-aligned technique to position a cover on a silicon (Si) or other substrate that supports a micro component.

Packaging for micro components, such as electronic and optical devices, should ensure that the individual devices function properly in their system environment. In general, issues such as mechanical bonding of the micro component, good thermal contact and electrical conductivity need to be addressed to ensure proper operation. Long-term stability is typically a desirable characteristic.

However, packaging of micro components can be a significant factor in the overall manufacturing cost.

SUMMARY

The invention relates to an assembly that uses a self-aligned technique to position a cover on a substrate that supports a micro component.

In one aspect, an assembly includes a substrate with a front surface on which a micro component is supported. The substrate includes an alignment slot in at least one of its side edges, and includes metallization coupled electrically to the micro component and extending from the front surface of the substrate to its back surface via at least one of the alignment slots. The assembly also includes a cover attached to the substrate so as to encapsulate the micro component. The cover includes at least one protrusion on its underside such that each protrusion mates with a respective one of the alignment slots in the substrate.

As used in this disclosure, the phrase "micro components" means electronic devices, optical devices, electromagnetic devices, chemical devices, micro-mechanical devices, optoelectronic devices, micro-electromechanical system (MEMS) devices, micro-optoelectromechanical system (MOEMS) devices or other such devices that contain tiny, micron and sub-micron-sized elements.

Various implementations may include one or more of the following features. For example, there may be a respective alignment slot in each side edge of the substrate, wherein the cover includes corresponding protrusions each of which mates, respectively, with one of the alignment slots. In some implementations, each alignment slot may slant outwardly from the front surface of the substrate to its back surface. The metallization extending from the front surface of the substrate to its back surface may include conductive lines electrically coupled to the micro component.

In some implementations, the cover may include a recessed cavity, with the micro component located within an area defined by the cavity. The cover may be formed of various materials, including, for example, a plastic material or an infra-red transparent polymer, and may be formed by injection-molding.

For implementations in which the micro component includes an optoelectronic device, it may be desirable to form the cover of a material that is transparent to a wavelength of light emitted or detected by the optoelectronic device.

Various implementations may include one or more of the following advantages. The foregoing techniques can facilitate alignment of the cover for a package that encapsulates a micro component. The techniques may help reduce overall manufacturing costs so that a low-cost package can be provided.

The details of one or more embodiments of the invention are set forth in the accompanying drawings and the description below. Other features and advantages of the invention may be apparent from the description, the drawings, and the claims.

DETAILED DESCRIPTION

Figure 1:
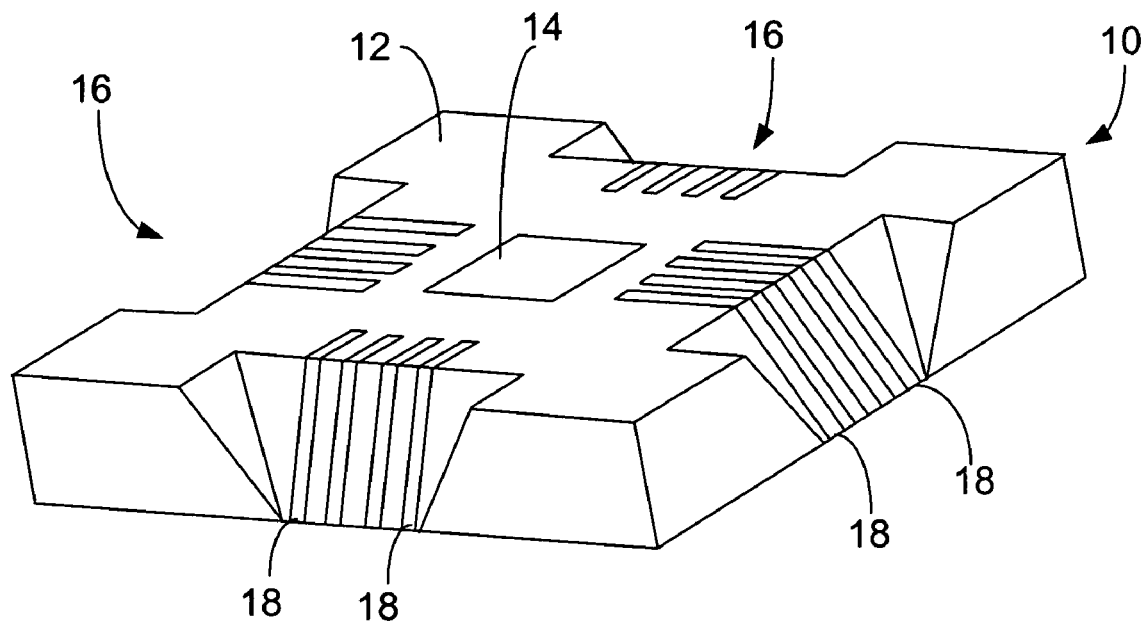
FIG. 1 illustrates the front side of a substrate with alignment slots according to an embodiment of the invention.

As shown in FIG. 1, the front side 12 of a silicon or other substrate 10 supports one or more micro components 14 and also may support passive components. The components can be connected to the substrate, for example, by die bonding, wirebonding or flip-chip bonding.

The substrate includes micro-machined alignment slots 16 at its periphery and electrical front-to-backside interconnect wiring 18. The wiring 18 provides electrical connections to the micro component 14. In the illustrated example, a micro-machined alignment slot 16 is provided in the mid-section of each side edge of the substrate 10. Additional alignment slots may be provided. The alignment slots need not be provided at the center of each side, but may be provided elsewhere along the side edges. For example, multiple alignment slots may be provided in each side edge of the substrate.

Figure 2:
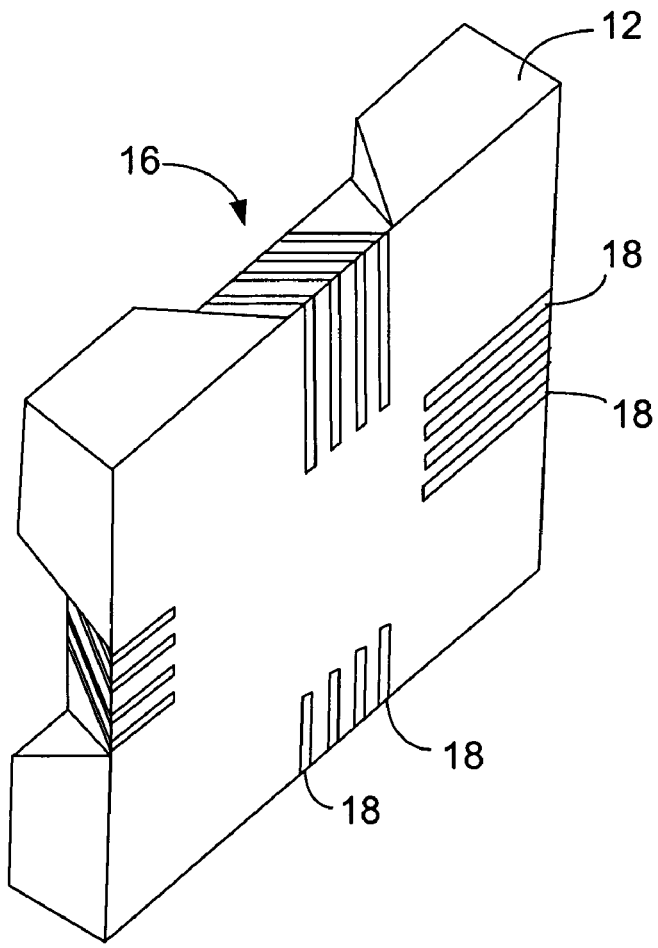
FIG. 2 illustrates the back side of the substrate.

FIG. 2 illustrates a backside view of the substrate 10. Conductive pads (not shown) electrically connected to the wiring 18 on the backside may be used as landings for soldering or may include solder bumps which can be soldered onto a flexible substrate. The number of input/output (I/O) pins for the components may be as high as fourteen or even larger, depending on the physical size of the components.

The alignment slots 16 preferably have slanted walls to facilitate deposition of the interconnect metallization for the wiring 18. The alignment slots may be formed, for example, by anisotropic etching of a silicon substrate using KOH. The particular etching technique and shape of the alignment slots may depend on the crystallographic orientation of the substrate.

Figure 3:
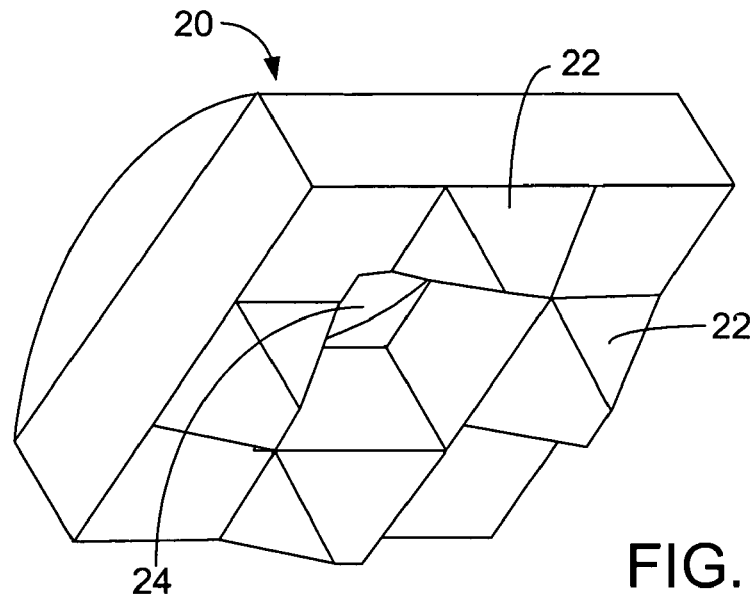
FIG. 3 illustrates a bottom view of a cover with protrusions to mate with the alignment slots on the substrate.

FIG. 3 illustrates a bottom view of an example of a plastic cover 20 with protrusions 22 that are designed to mate with the alignment slots 16 in the substrate 10. If the micro component 14 includes an optoelectronic device, the cover 20 should be transparent to a wavelength of light that is emitted or detected by the optoelectronic device. The cover 20 may be formed, for example, by precision injection molding and may include a recessed cavity 24 within which the micro component fits when the cover is attached to the substrate 10. The cover also may include a molded optical lens (not shown) to focus or otherwise modify the path of light to or from the optoelectronic device. The cover 20 may comprise an injection-molded infra-red (IR) transparent polymer that provides a lens and a well-defined insert for an optical fiber.

Figure 4:
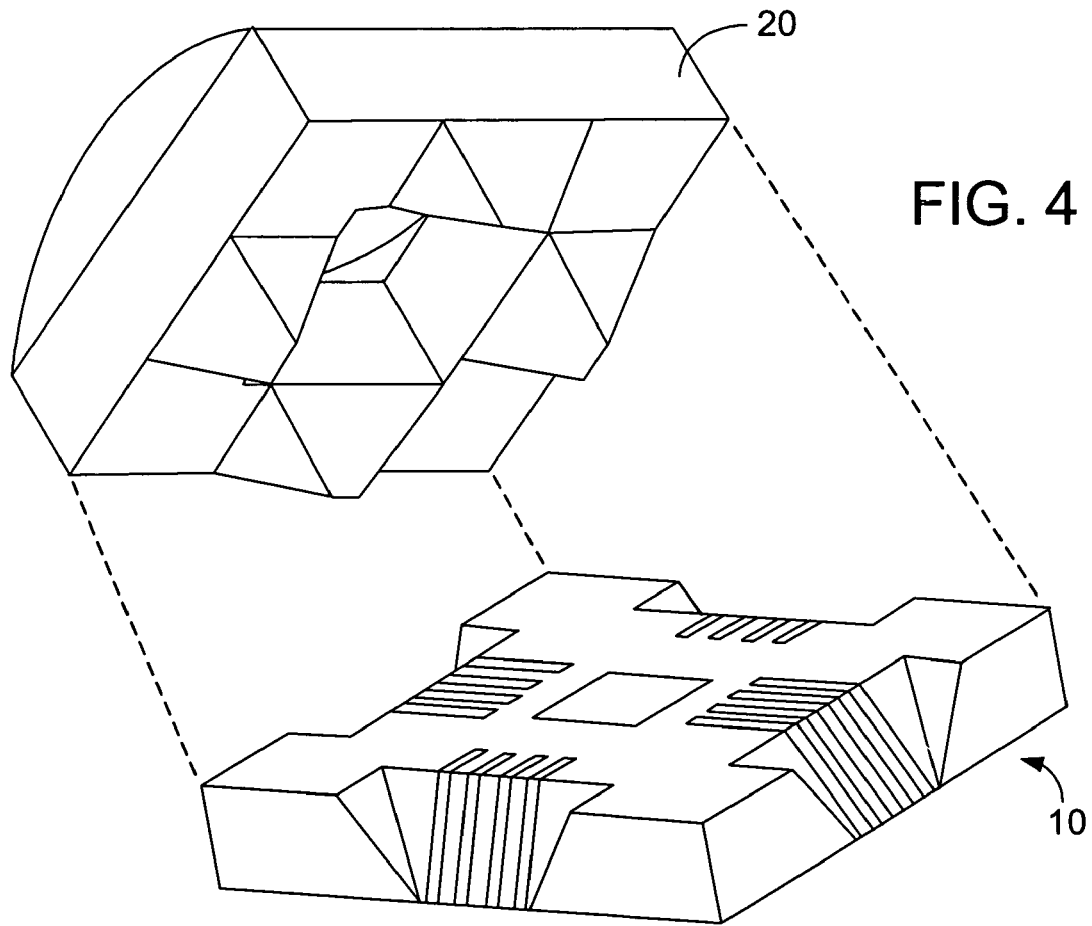
FIG. 4 illustrates how the cover and substrate may be assembled.

Once the micro component and any passive components are positioned on the front surface 12 of the substrate 10, the cover 20 may be attached to the substrate, as indicated by FIG. 4. The protrusions 22 on the underside of the cover 20 mate with the alignment slots 16 in the side edges of the substrate 10. An ultraviolet (UV) curable epoxy of other gluing technique may be used to bond the cover 20 to the substrate 10. The etched sidewalls should provide enough surface area to enable a mechanically stable bond.

In some implementations, a metal shield (not shown) may be provided as part of the cover 20 to reduce electromagnetic interference. The metal shield can include an opening to allow light to pass to or from an optoelectronic component encapsulated within the assembly.

Testing of the micro component 14 and any passive components including bonding (die attaching and wirebonding or flip-chip bonding) may be performed on a wafer scale. The assembled and tested substrates may be mounted, for example, on a flexible substrate.

For some applications, the accuracy of the alignment structures is estimated to be better than one micron (μm) for the silicon etching, four microns for the protrusions 22 that mate with the alignment slots 16, and two microns for the placement accuracy of an optoelectronic component that is to receive or emit light into an optical fiber connected to the module through the cover. In the illustrated implementation, the alignment set-up is symmetrical. Therefore, tolerances in the dimensions may result only in an alignment shift along the optical axis, which is the least critical. The passive alignment tolerances should be sufficient for coupling a PIN or multimode VCSEL device.

A number of implementations of the invention have been described. However, various modifications may be made without departing from the spirit and scope of the invention. Accordingly, other implementations are within the scope of the following claims.

What is claimed is:

1. An assembly comprising:
    a micro component;
    a substrate with a front surface supporting the micro component, wherein the substrate includes an alignment slot in at least one of its side edges, and wherein the substrate includes metallization electrically coupled to the micro component and extending from the front surface of the substrate to its back surface via the alignment slot; and
    a cover attached to the substrate so as to encapsulate the micro component, wherein the cover includes at least one protrusion on its underside such that each protrusion mates with a respective alignment slot in the substrate.

2. The apparatus of claim 1 including a respective alignment slot in each of two or more side edges of the substrate, wherein the cover includes corresponding protrusions each of which mates, respectively, with one of the alignment slots.

3. The apparatus of claim 1 including a respective alignment slot in each side edge of the substrate, wherein the cover includes corresponding protrusions each of which mates, respectively, with one of the alignment slots.

4. The apparatus of claim 3 wherein each alignment slot forms a slanted surface in a respective side-edge of the substrate.

5. The apparatus of claim 4 wherein each alignment slot slants outwardly from the front surface of the substrate to its back surface.

6. The apparatus of claim 3 wherein the metallization extending from the front surface of the substrate to its back surface includes conductive lines electrically coupled to the micro component.

7. The apparatus of claim 3 wherein the cover includes a recessed cavity, and wherein the micro component is located within an area defined by the cavity.

8. The apparatus of claim 3 wherein the cover comprises a plastic material.

9. The apparatus of claim 3 wherein the cover comprises an infra-red transparent polymer.

10. The apparatus of claim 3 wherein the micro component includes an optoelectronic device, and the cover comprises a material that is transparent to a wavelength of light emitted or detected by the optoelectronic device.

11. The apparatus of claim 3 wherein the cover comprises an injection-molded material.

12. The apparatus of claim 3 wherein the cover includes a molded optical lens.

13. An assembly comprising:
    an optoelectronic device;
    a substrate with a front surface supporting the optoelectronic device, wherein the substrate includes a respective alignment slot in each of its side edges, wherein each alignment slot has a surface that slants outwardly from the front surface of the substrate to its back surface, and wherein the substrate includes metallization electrically coupled to the optoelectronic device and extending from the front surface of the substrate to its back surface via the alignment slots; and
    a cover attached to the substrate so as to encapsulate the optoelectronic device, wherein the cover includes protrusions on its underside such that each protrusion mates with a respective alignment slot in the substrate, and wherein the cover comprises a material that is transparent to a wavelength of light emitted or detected by the optoelectronic device.

14. The apparatus of claim 13 wherein the cover comprises a plastic material.

15. The apparatus of claim 13 wherein the cover comprises an infra-red transparent polymer.

16. The apparatus of claim 13 wherein the cover comprises an injection-molded material.

17. The apparatus of claim 13 wherein the cover includes a molded optical lens.

* * * * *